United States Patent

Takakusaki et al.

(10) Patent No.: US 7,957,158 B2
(45) Date of Patent: Jun. 7, 2011

(54) CIRCUIT DEVICE

(75) Inventors: Sadamichi Takakusaki, Ota (JP);
Noriaki Sakamoto, Midori (JP);
Katsuyoshi Mino, Ota (JP)

(73) Assignees: Sanyo Electric Co., Ltd., Moriguchi (JP); Sanyo Semiconductor Co., Ltd., Ora-gun (JP)

( * ) Notice: Subject to any disclaimer, the term of this patent is extended or adjusted under 35 U.S.C. 154(b) by 586 days.

(21) Appl. No.: 11/928,782

(22) Filed: Oct. 30, 2007

(65) Prior Publication Data
US 2008/0119065 A1 May 22, 2008

(30) Foreign Application Priority Data
Oct. 31, 2006 (JP) ................................. 2006-296255

(51) Int. Cl.
*H05K 7/10* (2006.01)

(52) U.S. Cl. ........ 361/808; 361/760; 361/783; 361/810; 174/521; 174/528

(58) Field of Classification Search .................. 361/760, 361/761, 763, 765, 772, 782, 783, 807, 808, 361/762, 764, 766, 767, 768, 777, 803, 810–812; 174/520, 521, 524, 527, 528, 529, 533, 534, 174/535, 538, 541, 549, 551, 556, 557, 564, 174/250, 252, 255, 257, 259, 260, 261; 257/E23.066, E23.031, E23.042, E23.049, 257/E23.052, E23.056, E23.057, E23.06, 257/E23.141, 673, 693, 672, 676
See application file for complete search history.

(56) References Cited

U.S. PATENT DOCUMENTS

| 5,289,344 | A | * | 2/1994 | Gagnon et al. | 361/712 |
| 5,559,374 | A | * | 9/1996 | Ohta et al. | 257/723 |
| 5,926,372 | A | * | 7/1999 | Rinehart et al. | 361/704 |
| 2005/0263880 | A1 | | 12/2005 | Igarashi et al. | |
| 2005/0263905 | A1 | * | 12/2005 | Usui et al. | 257/774 |
| 2006/0258055 | A1 | * | 11/2006 | Okamoto | 438/124 |
| 2008/0290484 | A1 | * | 11/2008 | Low et al. | 257/675 |

FOREIGN PATENT DOCUMENTS

| CN | 2640202 Y | 9/2004 |
| CN | 1705105 A | 12/2005 |
| JP | 05-102645 | 4/1993 |

OTHER PUBLICATIONS

Chinese Office Action dated Jun. 5, 2009 (1 page).

* cited by examiner

*Primary Examiner* — Dameon E Levi
*Assistant Examiner* — Hoa C Nguyen
(74) *Attorney, Agent, or Firm* — Westerman, Hattori, Daniels & Adrian, LLP

(57) ABSTRACT

A circuit device having improved packaging density is provided. A circuit device of the present invention includes: a circuit board having its surface covered with an insulating layer; conductive patterns formed on a surface of the insulating layer; circuit elements electrically connected to the conductive patterns; and leads connected to pads formed of the conductive patterns. Furthermore, a control element is fixed to an upper surface of a land part formed of a part of a lead, and a back surface of the land part is spaced apart from an upper surface of the circuit board.

12 Claims, 7 Drawing Sheets

Background Art

CIRCUIT DEVICE

This invention claims priority from Japanese Patent Application Number JP2006-296255 filed on Oct. 31, 2006, the content of which is incorporated herein by reference in its entirety.

BACKGROUND OF THE INVENTION

1. Field of the Invention

The present invention relates to a circuit device and more particularly relates to a circuit device including a hybrid integrated circuit consisting of a large number of circuit elements such as a semiconductor element.

2. Description of the Related Art

With reference to FIG. 7, a configuration of a conventional hybrid integrated circuit device 100 will be described. This technology is described for instance in Japanese Patent Application Publication No. Hei 5 (1993)-102645. Conductive patterns 103 are formed on a surface of a rectangular board 101 with an insulating layer 102 interposed therebetween. Circuit elements are fixed to desired spots of the conductive patterns 103 to form a predetermined electric circuit. Here, as the circuit elements, a semiconductor element 105A and a chip element 105B are connected to the conductive patterns 103. Leads 104 are connected to pads 109, and function as external terminals. The pads 109 are made of the conductive patterns 103 formed in a peripheral portion of the board 101. A sealing resin 108 has a function to seal the electric circuit formed on the surface of the board 101.

The semiconductor element 105A is, for example, a power element through which a large current of 1 ampere or more passes and has a very large heat value. Thus, the semiconductor element 105A is placed above a heat sink 110 mounted on the conductive pattern 103. The heat sink 110 is formed of a metal piece such as copper having a size of the order of length×width×thickness=10 mm×10 mm×1 mm, for example. By adopting the heat sink 110, heat generated from the semiconductor element 105A can be actively released to the outside. Furthermore, although not shown in FIG. 7, an LSI having a large number of electrodes provided on its surface is provided as a circuit element on an upper surface of the board 101.

In the hybrid integrated circuit device 100 having the above configuration, all the elements constituting a hybrid integrated circuit are disposed on the upper surface of the board 101. Since the board 101 is made of metal having excellent heat release properties, heat generated from the circuit elements such as the semiconductor element 105A is favorably released to the outside through the board 101.

However, the circuit elements mounted on the board 101 also include those having a very small heat value, such as a small signal semiconductor element. Such a circuit element having a small heat value is not required to be mounted on the board 101 made of metal having excellent heat release properties. The mounting of the circuit element, for which heat release is not required, on the upper surface of the circuit board 101 as described above leads to a problem that substantial packaging density on the upper surface of the board 101 is reduced.

Furthermore, when the LSI or the like is disposed near the semiconductor element 105A having a very large heat value, heat generated from the semiconductor element 105A is conducted through the board 101 having excellent thermal conductivity. Thus, there is also a risk that the LSI is heated by the heat, so that characteristics thereof are deteriorated.

SUMMARY OF THE INVENTION

The present invention was made in consideration of the foregoing problems. A main object of the present invention is to provide a circuit device having improved packaging density.

A circuit device of the present invention includes: a circuit board; conductive patterns formed on an upper surface of the circuit board; circuit elements electrically connected to the conductive patterns, and leads which are electrically connected to the circuit elements and are drawn out to the outside. A semiconductor element is mounted on an upper surface of a land part formed of a part of the lead, and a lower surface of the land part is spaced apart from the upper surface of the circuit board.

A circuit device of the present invention includes: a circuit board; an insulating layer which covers an upper surface of the circuit board; conductive patterns formed on an upper surface of the insulating layer, circuit elements electrically connected to the conductive patterns; and leads which are electrically connected to the circuit elements, and which are drawn out to the outside. The circuit elements include a small signal semiconductor element and a large signal semiconductor element through which a current larger than that passing through the small signal semiconductor element passes. The small signal semiconductor element is mounted on an upper surface of a land part which is formed of a part of the lead, and which is spaced apart from the insulating layer. Moreover, the large signal semiconductor element is mounted on any one of the conductive pattern and a heat sink fixed to the conductive pattern.

Furthermore, a circuit device of the present invention includes: a circuit board; an insulating layer which covers an upper surface of the circuit board; conductive patterns formed on an upper surface of the insulating layer; and circuit elements electrically connected to the conductive patterns. Metal pattern pieces formed more thickly than the conductive patterns are additionally attached to the upper surface of the circuit board and used as wirings electrically connected to the circuit elements.

DESCRIPTION OF THE EMBODIMENTS

First Embodiment

In this embodiment, with reference to FIGS. 1 to 3, a structure of a hybrid integrated circuit device 10 as an example of a circuit device will be described.

Figure 1A:
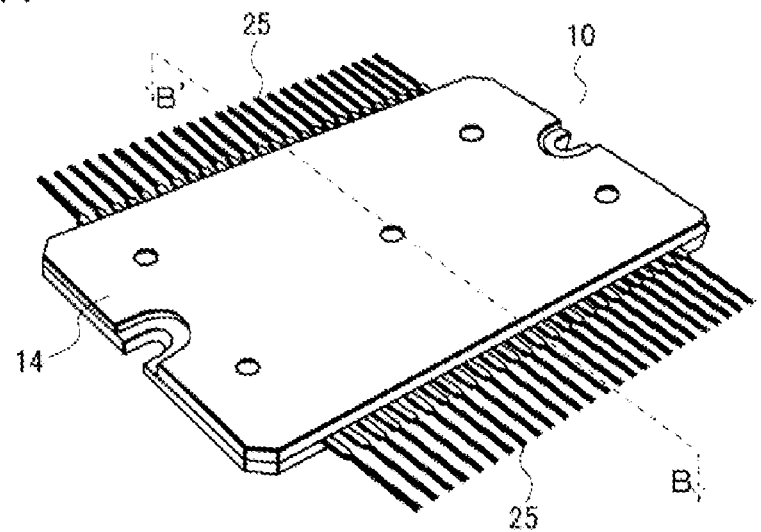
FIGS. 1A and 1B are perspective views showing a circuit device of the present invention.
Figure 1B:
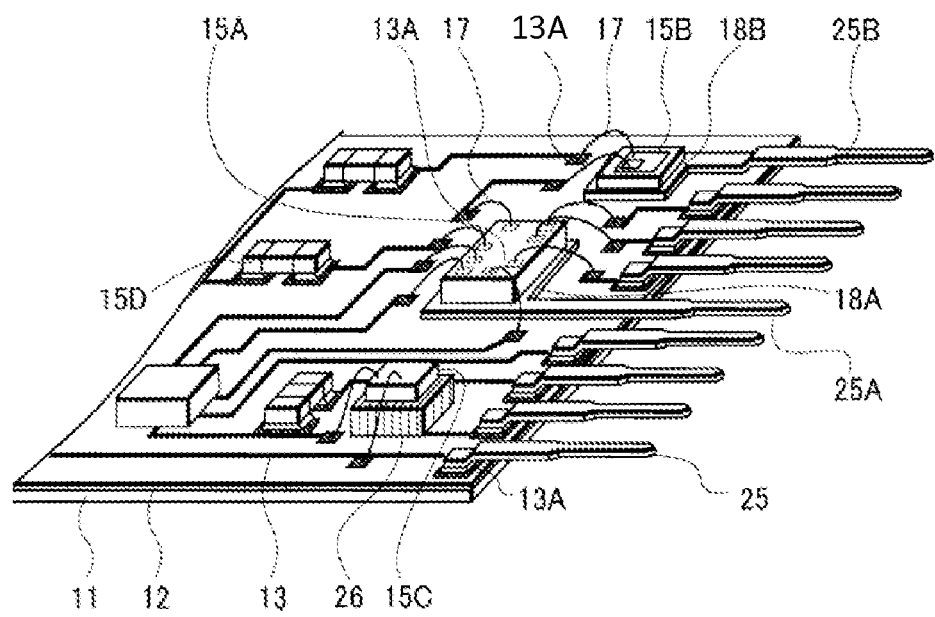
Figure 2:
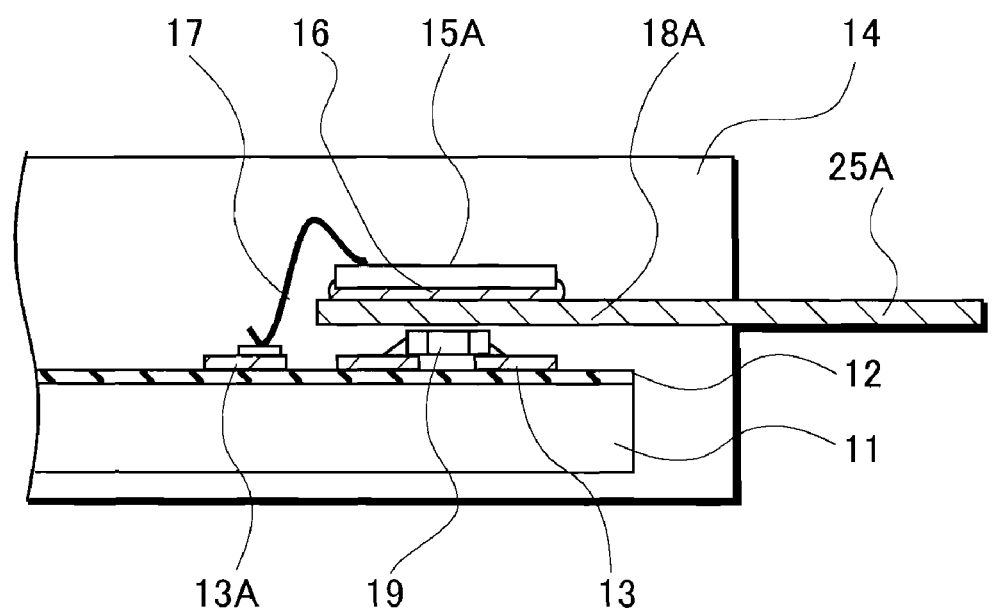
FIG. 2 is a cross-sectional view showing the circuit device of the present invention.

With reference to FIGS. 1A and 1B, a configuration of the hybrid integrated circuit device 10 of this embodiment will be described. FIG. 1A is a perspective view of the hybrid integrated circuit device 10 when viewed from obliquely above. FIG. 1B is a perspective view of the hybrid integrated circuit device 10 when a sealing resin 14 for sealing the entire device is omitted.

With reference to FIGS. 1A and 1B, the hybrid integrated circuit device 10 has a hybrid integrated circuit formed on an upper surface of a circuit board 11. Specifically, the hybrid integrated circuit includes conductive patterns 13 and circuit elements and has predetermined functions. To be more specific, first, the upper surface of the circuit board 11 having a rectangular shape is covered with an insulating layer 12. Moreover, the circuit elements such as a semiconductor element and a chip element are electrically connected to predetermined spots of the conductive patterns 13 formed on an upper surface of the insulating layer 12. Furthermore, the conductive patterns 13 and the circuit elements, which are formed on the surface of the circuit board 11, are covered with the seating resin 14. Moreover, leads 25 are drawn out to the outside from the sealing resin 14.

The circuit board 11 is a metal board mainly made of metal such as aluminum (Al) and copper (Cu). A specific size of the circuit board 11 is, for example, about length×width×thickness=30 mm×15 mm×1.5 mm. When a board made of aluminum is adopted as the circuit board 11, both principal surfaces of the circuit board 11 are subjected to alumite treatment.

The insulating layer 12 is formed so as to cover the entire upper surface of the circuit board 11. The insulating layer 12 is made of epoxy resin or the like, which is highly filled with filters such as $AL_2O_3$ at about 60 to 80 wt. %, for example. Although the sealing resin 14 for sealing the entire device similarly has fillers mixed therein, the insulating layer 12 contains more fillers mixed therein. By mixing the fillers, thermal resistance of the insulating layer 12 is reduced. Thus, heat generated from the circuit elements included in the device can be actively released to the outside through the insulating layer 12 and the circuit board 11. A specific thickness of the insulating layer 12 is, for example, about 50 μm. Moreover, although only the upper surface of the circuit board 11 is covered with the insulating layer 12 in FIGS. 1A and 1B, a back surface of the circuit board 11 may also be covered with the insulating layer 12. Accordingly, even if the back surface of the circuit board 11 is exposed to the outside from the sealing resin 14, the back surface of the circuit board 11 can be insulated from the outside.

The conductive patterns 13 are made of metal such as copper and formed on the surface of the insulating layer 12 so as to form a predetermined electric circuit. Moreover, on a side from which the leads 25 are drawn out, pads 13A formed of the conductive patterns 13 are formed. Furthermore, a number of pads 13A are also formed around a control element 15A (a land part 18A), and the pads 13A and the control element 15A are connected to each other through thin metal wires 17. Although, here, FIG. 1B shows a single layer of the conductive patterns 13, a plurality of layers of conductive patterns 13 that are laminated with insulating layers interposed therebetween may be formed on the upper surface of the circuit board 11.

The conductive patterns 13 are formed by patterning a thin conductive film having a thickness of about 50 μm to 100 μm, which is provided on the upper surface of the insulating layer 12. Therefore, the conductive patterns 13 can be formed to have a width as narrow as about 50 μm to 100 μm. Moreover, a distance between the conductive patterns 13 can also be set as narrow as about 50 μm to 100 μm. Therefore, even if the control element 15A is an element having several hundred electrodes, the pads 13A corresponding to the number of the electrodes can be formed around the control element 15A. Furthermore, the minutely formed conductive patterns 13 enable a complex electric circuit to be formed on the surface of the circuit board 11.

As the circuit elements electrically connected to the conductive patterns 13, active elements or passive elements can be generally adopted. To be more specific, a transistor, an LSI chip, a diode, a chip resistor, a chip capacitor, an inductance, a thermistor, an antenna, an oscillator and the like can be adopted as the circuit elements. Furthermore, as the circuit element, a resin-sealed package or the like can also be fixed to the conductive pattern 13.

With reference to FIG. 1B, the control element 15A, power elements 15B and 15C and a chip element 151D are provided as the circuit elements on the upper surface of the circuit board 11.

The control element 15A is a semiconductor element (a small signal semiconductor element) which has a predetermined electric circuit formed on its surface and supplies an electric signal (control signal) to a control electrode of the power element 15B. The control element 15A is a semiconductor element through which a current less than 1 ampere, for example, passes and has a very small heat value. Thus, there is no risk that the control element is heated to 100° C. or higher, for example. Therefore, it is also possible to mount the control element 15A directly on the upper surface of the circuit board 11. However, in this case, an advantage that the circuit board 11 has excellent heat release properties cannot be utilized. Moreover, since the control element 15A has a small heat value, the control element can also be included in the device so as to be spaced apart from the upper surface of the circuit board 11. Thus, in this embodiment, the control element 15A is mounted on an upper surface of the land part 18A of a lead 25A and a lower surface of the land part 18A is spaced apart from the upper surface of the circuit board 11. The above configuration will be described in detail later with reference to FIG. 2. Moreover, as the control element 15A, a resin-sealed package with a built-in semiconductor which is disposed so as to expose an IC, an LSI, a transistor and an electrode on its upper surface can be adopted.

Each of the power elements 15B and 15C is an element (a large signal semiconductor element) in which a large current of 1 ampere or more, for example, passes through a main electrode, and an operation thereof is controlled by the control element 15A. To be more specific, a MOSFET (Metal-Oxide Semiconductor Field Effect Transistor), an IGBT (insulated Gate Bipolar Transistor), an IC (Integrated Circuit), a bipolar transistor or the like can be adopted as the power element 15B. Here, the power element 15B is mounted on an upper surface of a land part 18B formed of a part of a lead 25B. This matter will be described in detail below.

Furthermore, the power element 15C is mounted on an upper surface of a heat sink 26 having the configuration described above. Here, the power element 15C may be fixed directly to a land-shaped conductive pattern 13 disposed on the upper surface of the insulating layer 12.

The sealing resin 14 is formed by transfer molding using a thermosetting resin or by injection molding using a thermoplastic resin. Here, the conductive patterns 13, the circuit elements, the thin metal wires 17 and the like are sealed by the sealing resin 14. Moreover, the entire circuit board 11 including also the back surface thereof may be covered with the sealing resin 14 or the back surface of the circuit board 11 may be exposed from the sealing resin 14. Furthermore, for the purpose of improving thermal conductivity and the like, fillers such as silicon oxide are mixed in the sealing resin 14. For example, the sealing resin 14 is made of a thermosetting resin having the fillers mixed therein at about 10% to 20%. Here, in consideration of reduction in thermal resistance, it is better for the sealing resin 14 to contain a large amount of the fillers. However, in order to prevent occurrence of voids in a resin sealing step, the amount of the filters to be mixed is determined within a range that makes it possible to secure not less than a certain degree of fluidity for the sealing resin 14.

One ends of the leads 25 are electrically connected to the pads 13A on the circuit board 11 and the other ends thereof are drawn out to the outside from the sealing resin 14. Specifically, the leads 25 are electrically connected to the circuit elements through the conductive patterns 13 formed on the upper surface of the circuit board 11. The leads 25 are made of meta mainly made of copper (Cu), aluminum (Al), Fe—Ni alloy or the like. Here, the leads 25 are connected to the pads 13A provided along two opposite sides of the circuit board 11. However, the pads 13A may be provided along one side or four sides of the circuit board 11 and the leads 25 may be connected to the pads 13A.

Moreover, in order to prevent short-circuiting between a side face of the circuit board 11, on which metal is exposed, and each of the leads 25, the lead 25 is bent to have a gull-wing shape. Specifically, a slope part sloping upward in a region on the inner side than a peripheral edge of the circuit board 11 is provided in the middle of the lead 25, and the rest of the lead 25 is extended parallel to the upper surface of the circuit board 11. Moreover, the lead 25A disposed so as to be spaced apart from the upper surface of the circuit board 11 may have a straight shape with no slope part provided.

In this embodiment, the land part 18A is provided in a part of the lead 25A and a back surface of the land part 18A is spaced apart from the upper surface of the circuit board 11. Furthermore, the control element 15A is mounted on the upper surface of the land part 18A. Accordingly, a circuit element and the conductive patterns 13 can be disposed in a region below the land part 18A. Thus, packaging density of the entire device can be increased. Furthermore, the control element 15A can be thermally spaced apart from the circuit board 11. Thus, the control element 15A can be prevented from being adversely affected by heat generated from the other circuit elements.

The land part 18A is a part obtained by forming an end of the lead 25A into a land shape so as to enable the control element 15A to be mounted thereon. A planar size of the land part 18A may be the same as that of the control element 15A mounted thereon or may be larger or smaller than that of the control element 15A. The land part 18A is disposed above the circuit board 11.

On the upper surface of the circuit board 11 around the land part 18A, a plurality of pads 13A formed of the conductive patterns 13 are arranged. Moreover, electrodes arranged on an upper surface of the control element 15A are electrically connected to the pads 13A through thin metal wires 17.

Next, description will be given of a configuration of the land part 18B of the lead 25B, on which the power element 15B is mounted. The land part 18B is formed of a part of the lead 25B. Moreover, the lead 25B is fixed to the circuit board 11 by attaching a back surface of the land part 18B to the upper surface of the circuit board 11. A planar size of the land part 18B is the same as that of the power element 15B mounted thereon.

The lead 25B is formed by etching or pressing a metal plate having a thickness of about 0.5 mm. Therefore, the lead 25B is formed to be thicker than the conductive patterns 13 formed on the upper surface of the circuit board 11. Thus, the land part 18B formed of a part of the lead 25B is also formed to be thick and functions as a heat sink to contribute to improvement in release of heat generated from the power element 15B. Here, the heat generated from the power element 15B is favorably released to the outside through the land part 18B, the insulating layer 12 and the circuit board 11.

The power element 15B is fixed to an upper surface of the land part 18B of the lead 25B by use of a conductive bonding material such as solder. Therefore, a back surface electrode of the power element 15B is directly connected to the lead 25B without using the conductive patterns 13 on the circuit board 11. Accordingly, it is not necessary to form wide conductive patterns 13 on the surface of the circuit board 11 for securing a large current capacity. Thus, the circuit board 11 can be reduced in size. Moreover, the lead 25B has a cross-section as large as about length×width=0.5 mm×0.5 mm, for example, and thus can secure a sufficient current capacity.

Furthermore, electrodes formed on an upper surface of the power element 15B are connected to the pads 13A on the circuit board 11 through thin metal wires 17. When a sufficient current capacity is required, thick wires having a diameter of about 150 μm or more are used as the thin metal wires 17.

Furthermore, in the hybrid integrated circuit device 10 having the configuration described above, the leads 25 may be disposed on the upper surface of the circuit board 11 (the upper surface of the insulating layer 12) and used as wirings. In this case, first, the leads 25 are mounted on the upper surface of the insulating layer 12 which covers the circuit board 11. Here, each of the leads 25 mounted on the upper surface of the circuit board 11 may have its one end drawn out to the outside of the circuit board 11 or may have its both ends positioned inside the circuit board 11. Moreover, in this case, each of the leads 25 disposed on the upper surface of the circuit board 11 can also be called a metal pattern piece.

In the above case, for example, a power element such as a power MOS is connected to one end of the lead 25. As a structure in which the power element is connected to the lead 25, the power element may be fixed to a land formed integrally with the lead 25 or may be connected to the lead 25 through a thin metal wire. Moreover, another power element may be connected to the other end of the lead 25 or a control element or a passive element may be connected thereto.

By using the leads 25 disposed on the upper surface of the circuit board 11 as the wirings as described above, the wirings which allow large currents to pass can be secured on the upper surface of the circuit board 11 since each of the leads 25 has a large cross-sectional area compared with the conductive patterns 13 formed on the upper surface of the circuit board 11. Here, the conductive patterns 13 are formed by attaching a thin conductive foil having a thickness of about 35 μm to 50 μm to the upper surface of the circuit board 11 and etching the conductive foil. Recently, in response to the need to handle large currents, conductive patterns thicker than the conductive patterns 13 are required. However, when it is tried to form two kinds of conductive patterns having different thicknesses from the same conductive foil, there arises a problem that a process flow is extended even though such conductive patterns can be formed by carrying out etching several times.

Accordingly, in this embodiment, the metal pattern pieces described above are pressed or etched to form a lead frame having leads connected integrally therewith. Moreover, by attaching the lead frame to the upper surface of the circuit board 11 after the conductive patterns 13 are formed thereon, wirings can be easily formed. In this case, the metal pattern pieces and the leads disposed on the upper surface of the circuit board 11 have the same thickness.

Moreover, when it is tried to secure wirings having a large cross-sectional area for allowing large currents to pass by use of the conductive patterns 13, thick conductive patterns 13 having a width of about several mm are required. Meanwhile, since the thickness of the leads 25 is as large as about 0.5 mm, it is not necessary to increase the width thereof for increasing the cross-sectional area thereof. Therefore, by using the leads 25 as the wirings, electrodes or islands through which large currents pass, an area occupied by the wirings through which the large currents pass is reduced. Thus, the packaging density on the upper surface of the circuit board 11 can be improved. Here, portions to be the wirings are narrow leads 25 extended integrally with the islands.

With reference to a cross-sectional view of FIG. 2, description will be given of a configuration in a spot where the control element 15A is mounted. As described above, the control element 15A is bonded to the upper surface of the land part 18A formed of a part of the lead 25A by use of a bonding material 16 such as solder. Furthermore, the tower surface of the land part 18A is spaced apart from the upper surface of the circuit board 11. Here, as a structure in which the tower surface of the land part 18A is spaced apart from the upper surface of the circuit board 11, the following two structures are conceivable. Specifically, one is a structure in which the land part 18A is floated above the upper surface of the circuit board 11 as shown in FIG. 2. The other one is a structure in which a resin film is formed so as to cover the conductive patterns 13 on the circuit board 11 and the land part 18A is disposed on an upper surface of the resin film.

The configuration described above enables the conductive patterns 13 and a circuit element 19 to be disposed on the upper surface of the circuit board 11 in a region below the land part 18A. Accordingly, more conductive patterns 13 and circuit elements can be arranged on the upper surface of the circuit board 11. Thus, the packaging density is improved. Particularly, the control element 15A is a circuit element having a large mounting area to be occupied compared with the other circuit elements. Therefore, by disposing the conductive patterns 13 and the circuit element 19 in a region below the large control element 15A, a more complex and highly functional electric circuit can be included in the device. Furthermore, a space between the back surface of the land part 18A and the upper surface of the circuit board 11 is filled with the seating resin 14.

Since the land part 18A having the control element 15A mounted thereon is spaced apart from the upper surface of the circuit board 11, heat release through the circuit board 11 cannot be expected. Thus, heat generated from the control element 15A is made less likely to be released to the outside. However, the control element 15A itself generates only a small amount of heat and a certain amount of heat is released through the lead 25A. Thus, deterioration of characteristics due to heating of the control element 15A is suppressed.

Figure 3A:
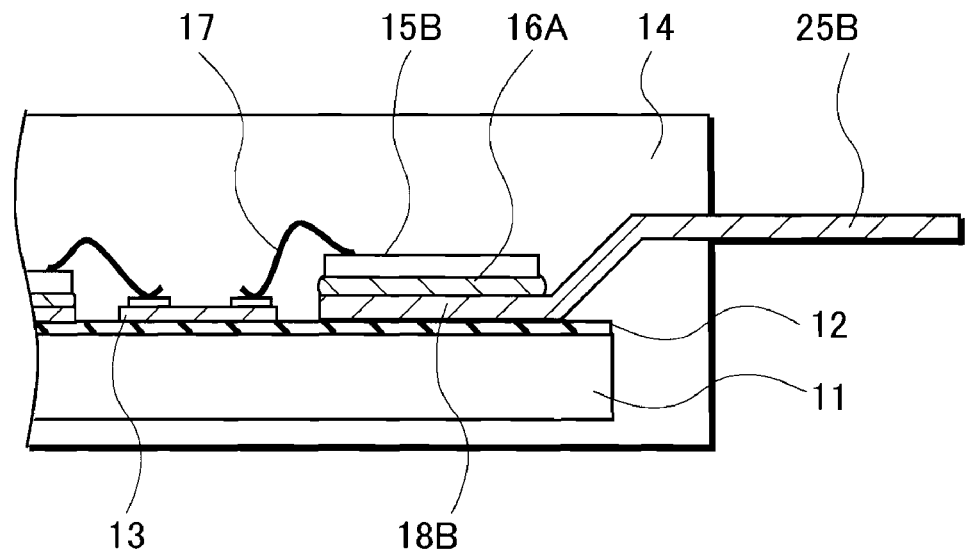
FIGS. 3A and 3B are cross-sectional views showing the circuit device of the present invention.
Figure 3B:
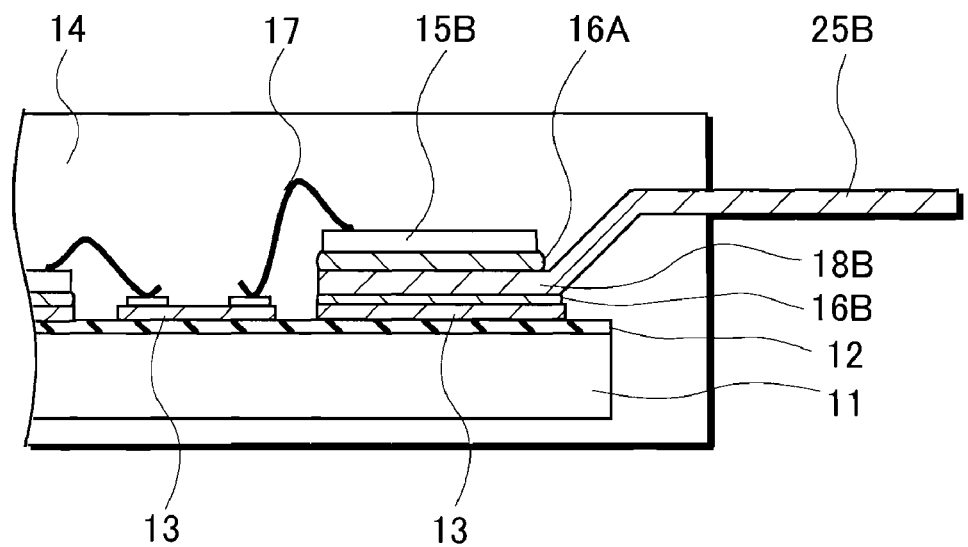

Next, with reference to FIGS. 3A and 3B, description will be given of a structure for connecting the power element 15B. FIGS. 3A and 3B are cross-sectional views showing a structure for fixing the power element 15B.

With reference to FIG. 3A, here, the land part 18B of the lead 25B is fixed directly to the insulating layer 12 which covers the upper surface of the circuit board 11. In this case, after the land part 18B is attached to the upper surface of the insulating layer 12 in a B stage state, the insulating layer 12 is heated and cured to fix the back surface of the land part 18B to the circuit board 11. By use of such a structure, only the insulating layer 12 is interposed between the land part 18B and the circuit board 11. Thus, heat generated from the power element 15B can be efficiently released to the outside.

In FIG. 3B, the back surface of the land part 18B is fixed to the land-shaped conductive pattern 13, which is formed on the upper surface of the insulating layer 12, by use of a bonding material 16B such as solder.

Moreover, in this case, for a bonding material 16A used for mounting the power element 15B and the bonding material 16B used for mounting the land part 18B, it is preferable to adopt those having different melting points.

To be more specific, in the case where the back surface of the land part 18B is mounted on the circuit board 11 after the power element 15B is fixed to the upper surface of the land part 18B, it is preferable that a melting temperature of the bonding material 16A be set higher than that of the bonding material 16B. Thus, melting of the bonding material 16A can be prevented in a step of mounting the land part 18B, to which the power element 15B is fixed by use of the bonding material 16A on the circuit board 11 by use of the melted bonding material 16B.

Moreover, in the case where the power element 15B is mounted on the land part 18B after the land part 18B is fixed to the circuit board 11, it is preferable that the melting temperature of the bonding material 16B be set higher than that of the bonding material 16A. Thus, melting of the bonding material 16B used for fixing the land part 18B can be prevented in a step of mounting the power element 15B on the upper surface of the land part 18B by melting the bonding material 16A.

Second Embodiment

In this embodiment, with reference to FIGS. 4 to 6, description will be given of a method for manufacturing the hybrid integrated circuit device having the above configuration.

Figure 4A:
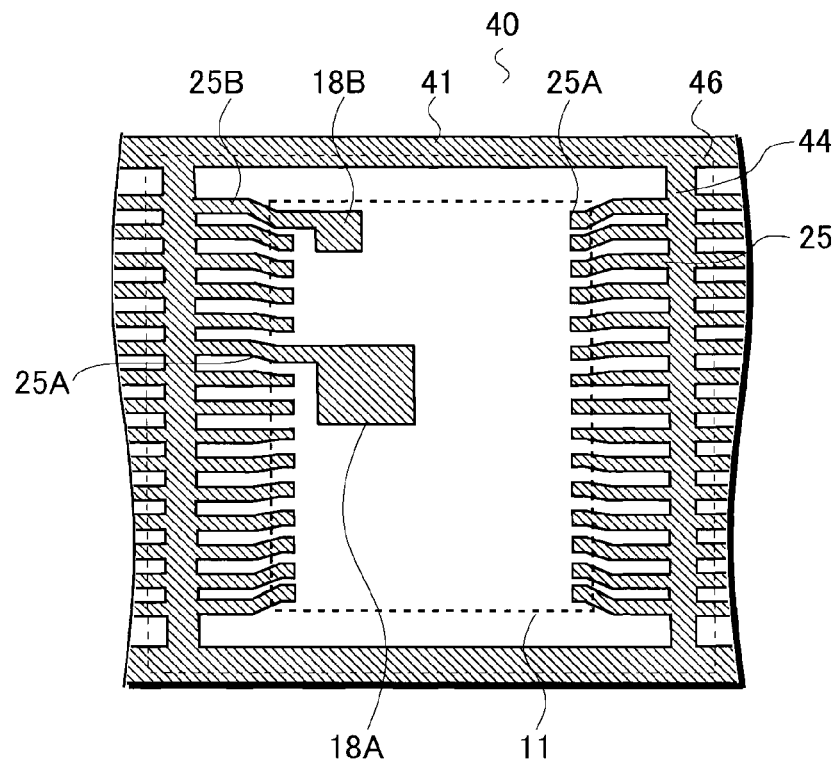
FIGS. 4A and 4B are plan views and FIG. 4C is a cross-sectional view showing a method for manufacturing the circuit device of the present invention.
Figure 4B:
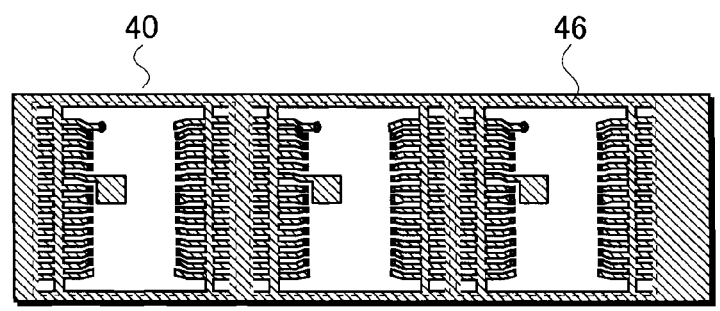
Figure 4C:
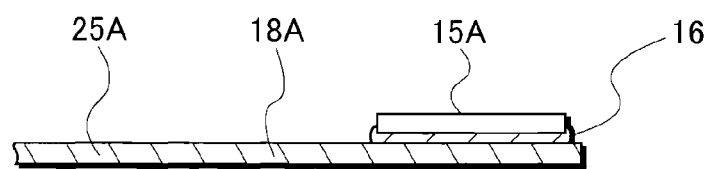

With reference to FIGS. 4A to 4C, first, a lead frame 40 having a number of leads 25 provided therein is prepared. FIG. 4A is a plan view showing one of units 46 provided in the lead frame 40. FIG. 4B is a plan view showing the entire lead frame 40. FIG. 4C is a cross-sectional view showing a land part 18A provided in a lead 25A. In FIG. 4A, a region where a circuit board 11 is mounted in a subsequent step is indicated by a dotted line.

With reference to FIG. 4A: the unit 46 consists of a number of the leads 25 included in one hybrid integrated circuit device. One end of each of the leads 25 is positioned within the region where the circuit board 11 is mounted. Here, the leads 25 are extended toward the region where the circuit board 11 is mounted from both left and right directions on the page space. The plurality of leads 25 are connected to each other by tie bars 44 extended from an outer frame 41. Thus, deformation of the leads is prevented.

Furthermore, in this embodiment, land parts are provided by forming some of the leads 25 to have wide tip portions. To be more specific, a lead 25A is formed to have a wide tip portion to provide a land part 18A. This land part 18A is for mounting a control element formed of an LSI or the like. Furthermore, a lead 25B is formed to have a wide tip portion to provide a land part 18B. This land part 18B is for mounting a power semiconductor element such as a power MOS. Here, a plurality of the land parts 18A and 18B may be provided.

With reference to FIG. 4B, in the lead frame 40 having a strip shape, a plurality of the units 46 having the configuration as described above are arranged so as to be spaced apart. In this embodiment, the hybrid integrated circuit device is manufactured by providing the plurality of units 46 in the lead frame 40. Thus, productivity is improved by collectively performing a wire bonding step, a molding step and the like.

With reference to FIG. 4C, here, before the circuit board 11 is fixed to the lead frame 40, a control element 15A is fixed to the land part 18A in the lead 25A. Here, a back surface of the control element 15A is fixed to an upper surface of the land part 18A by use of a bonding material 16 made of solder or conductive paste. Similarly, a power element may also be mounted on an upper surface of the land part 18B provided in the lead 25B. Moreover, although, here, the circuit element is mounted on the upper surface of the land part 18A or the like before the circuit board 11 is fixed to the lead frame 40, the circuit element may be mounted on the land pad 18A or the like after the circuit board 11 is fixed to the lead frame 40. Similarly, the land part 18B may be prepared in a state of having a power element mounted on its upper surface.

Figure 5A:
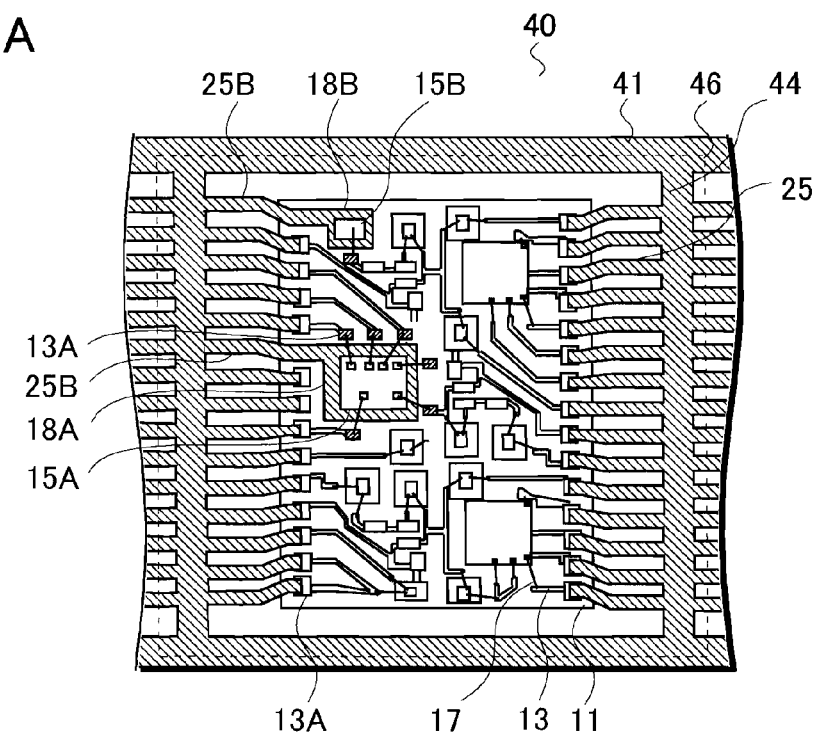
FIG. 5A is a plan view and FIGS. 5B and 5C are cross-sectional views showing the method for manufacturing the circuit device of the present invention.
Figure 5B:
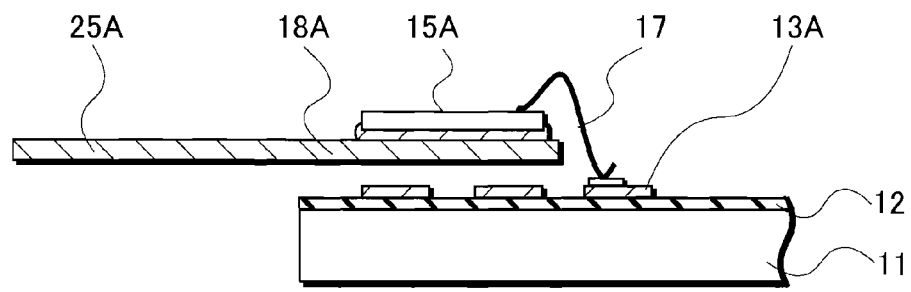
Figure 5C:
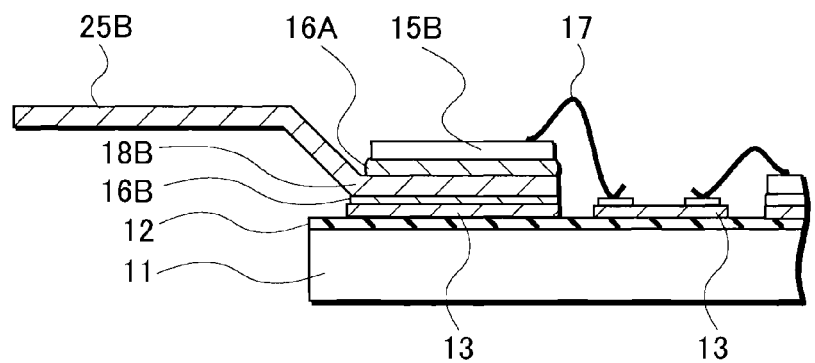

With reference to FIGS. 5A to 5C next, the circuit board 11 is fixed to the lead frame 40. FIG. 5A is a plan view showing the unit 46 in the lead frame 40. FIG. 5B is a cross-sectional view of the land pan 18A. FIG. 5C is a cross-sectional view of the land part 18B.

With reference to FIG. 5A, the circuit board 11 is fixed to the lead frame 40 by fixing the leads 25 to pads 13A formed in a peripheral portion of the circuit board 11. The tip portions of the leads 25 are fixed to the pads 13A on the circuit board 11 by use of a fixing agent such as solder.

Furthermore, circuit elements such as semiconductor elements are mounted on the circuit board 11. Here, the circuit board 11 having the circuit elements previously mounted thereon may be fixed to the lead frame 40 or the circuit elements may be mounted on the circuit board 11 after the circuit board 11 is fixed to the lead frame 40. Furthermore, the mounted circuit elements are connected to conductive patterns 13 through thin metal wires 17.

With reference to FIG. 5B, here, electrodes on an upper surface of the control element 15A disposed on the upper surface of the land part 18A are connected to the pads 13A disposed on the upper surface of the circuit board 11 through the thin metal wires 17. Furthermore, as described above, a lower surface of the land part 18A is disposed above the circuit board 11 so as to be spaced apart from the upper surface thereof. Thus, the conductive patterns 13 and circuit elements can be disposed on the upper surface of the circuit board 11 in a region below the land part 18A.

With reference to FIG. 5C, a back surface of the land part 18B formed in the tip portion of the lead 25B is fixed to a land-shaped conductive pattern 13 by use of a bonding material 16B such as solder. Furthermore, a power element 15B such as a power MOS is fixed to the upper surface of the land part 18B by use of a bonding material 16A. Moreover, electrodes formed on an upper surface of the power element 15B are connected to the conductive patterns 13 through the thin metal wires 17.

Figure 6A:
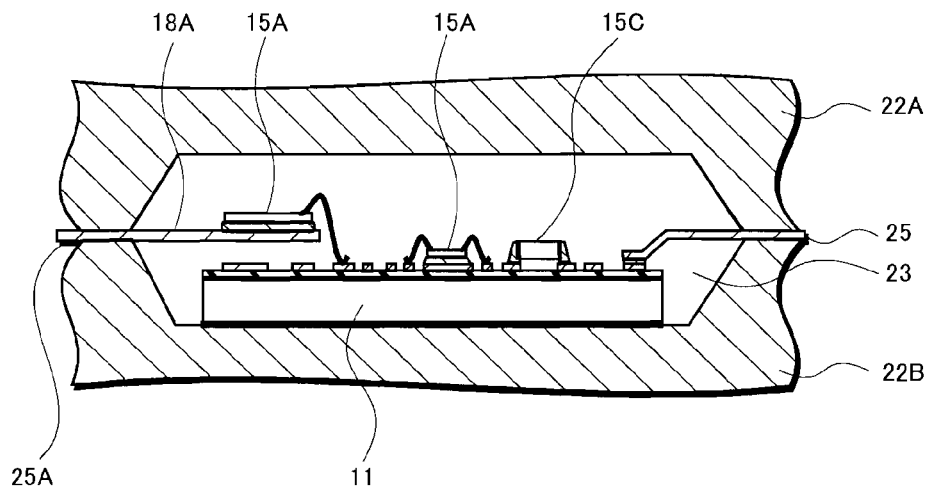
FIG. 6A is a cross-sectional view and FIG. 6B is a plan view showing the method for manufacturing the circuit device of the present invention.
Figure 6B:
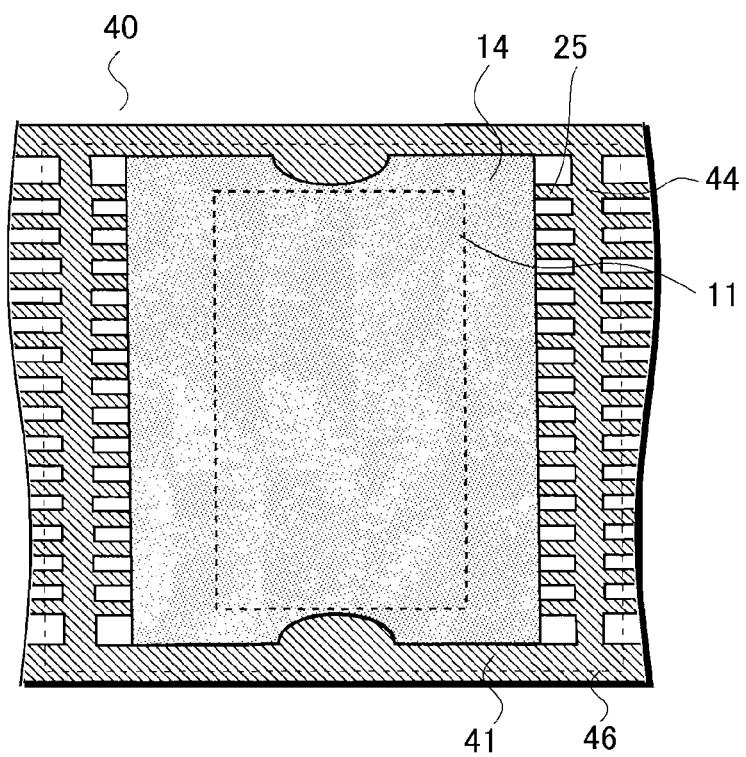
Figure 7:
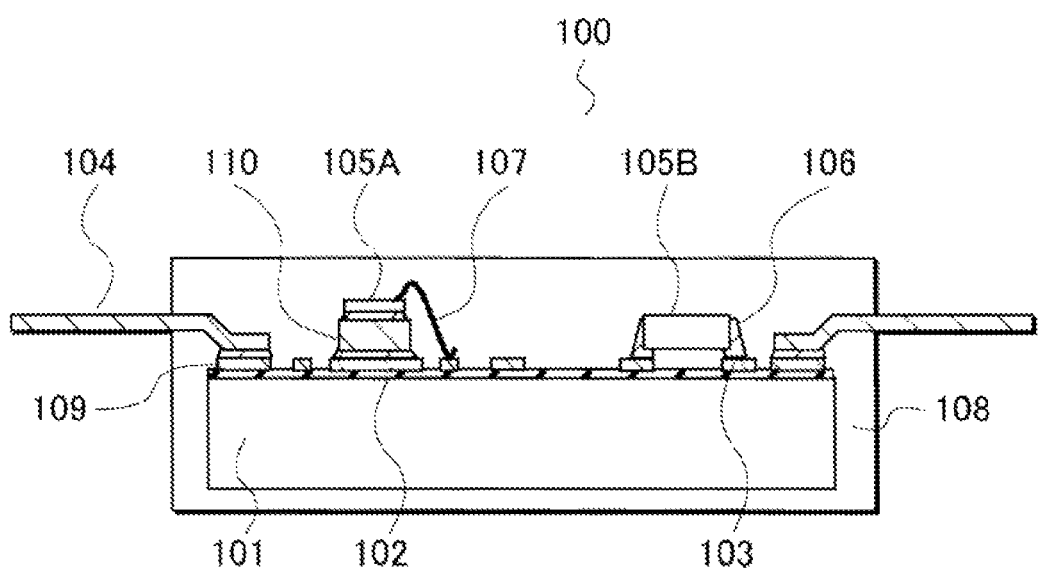
FIG. 7 is a cross-sectional view showing a conventional hybrid integrated circuit device.

With reference to FIGS. 6A and 6B, next, a sealing resin is formed so as to cover the circuit board 11. FIG. 6A is a cross-sectional view showing a step of molding the circuit board 11 by use of a mold. FIG. 6B is a plan view showing the lead frame 40 after the molding.

With reference to FIG. 6A, first, the circuit board 11 is housed in a cavity 23 formed by an upper mold 22A and a lower mold 22B. Here, a position of the circuit board 11 inside the cavity 23 is fixed by allowing the upper and lower molds 22A and 22B to come into contact with the leads 25. Furthermore the circuit board 11 is sealed by injecting a resin into the cavity 23 from a gate (not shown) provided in the mold. In this step, transfer molding using a thermosetting resin or injection molding using a thermoplastic resin is performed. Here, as a structure for sealing the circuit board 11, a potting, a casing or the like may be used for sealing.

As described above, in this embodiment, the control element 15A is mounted on the upper surface of the land part 18A in the lead 25A and the back surface of the land part 18A is spaced apart from the upper surface of the circuit board 11. Moreover, the space between the back surface of the land part 18A and the upper surface of the circuit board 11 is also filled with the sealing resin. In order to favorably perform the filling, a distance between the lower surface of the land part 18A and the upper surface of the circuit board 11 may be set to 0.5 mm or more, for example.

With reference to FIG. 6B, after the molding step described above is finished, the leads 25 are spaced apart from the lead frame 40. To be more specific, the leads 25 are individually spaced apart at the spots where the tie bars 44 are provided. Thus, the hybrid integrated circuit device as shown in FIGS. 1A and 1B is spaced apart from the lead frame 40.

In the circuit device of the present invention, the semiconductor element is mounted on the upper surface of the land part formed of a part of the lead and the lower surface of the land part is spaced apart from the upper surface of the circuit board. Thus, the semiconductor element which has a small heat value and is not required to be mounted on the circuit board can be disposed at a position other than the upper surface of the circuit board in the device. As a result, packaging density of the entire device can be improved.

Furthermore, the semiconductor element which is mounted on the land part and disposed so as to be spaced apart from the circuit board is thermally spaced apart from the circuit board. Therefore, not much heat generated from other power semiconductor elements mounted on the circuit board is conducted to the semiconductor element positioned so as to be spaced apart from the circuit board. Thus, it is possible to suppress deterioration of characteristics and the like due to the heat generated from the semiconductor elements.

What is claimed is:

1. A circuit device comprising:
   a circuit board;
   conductive patterns formed on an upper surface of the circuit board;
   circuit elements electrically connected to the conductive patterns;
   leads which are electrically connected to the circuit elements, and which are drawn out to the outside; and
   sealing resin covering the circuit elements, the circuit board and the conductive patterns,
   wherein
   a semiconductor element is mounted on an upper surface of a land part formed of a part of the lead,
   a lower surface of the land part is spaced apart from the upper surface of the circuit board,
   the sealing resin is made of an insulating material and fills a space between the land part and the circuit board; and
   wherein the sealing resin fills the entire space between the land part and the circuit board and insulates the land part and the circuit board.

2. The circuit device according to claim 1, wherein electrodes provided on an upper surface of the semiconductor element mounted on the land part are connected to pads formed of the conductive patterns through thin metal wires.

3. The circuit device according to claim 1, wherein the conductive patterns are extended on the circuit board in a region below the land part.

4. The circuit device according to claim 1, wherein the circuit element is disposed on the circuit board in a region below the land part.

5. The circuit device according to claim 1, wherein at least a part of the conductive patterns is provided and covered with a resin film and the land part is mounted on an upper surface of the resin film.

6. The circuit device according to claim 1, wherein
the conductive patterns are formed on an upper surface of an insulating layer which covers the upper surface of the circuit board,
a sealing resin is formed so as to cover the circuit elements and the conductive patterns, and
the insulating layer contains more fillers than the sealing resin.

7. The circuit device according to claim 1, wherein the semiconductor element which is mounted on the land part is a control element.

8. The circuit device according to claim 1, further comprising a second land part and a power transistor mounted on the second land part, wherein a lower surface of the second land part is attached to the upper surface of the circuit board.

9. The circuit device according to claim 1, wherein the circuit elements include an active element.

10. The circuit device according to claim 1, wherein the circuit elements include a passive element.

11. The circuit device according to claim 1, wherein the circuit elements include a transistor.

12. The circuit device according to claim 1, wherein the circuit elements include a chip.

* * * * *